United States Patent [19]

Cote

[11] Patent Number: 5,402,085
[45] Date of Patent: Mar. 28, 1995

[54] PROCESS AND DEVICE FOR COMPENSATION OF PHASE INSTABILITIES OF THE WAVE AMPLIFIED BY A MICROWAVE TUBE

[75] Inventor: Gilles Cote, Poissy, France

[73] Assignee: Thomson-CSF, Puteaux, France

[21] Appl. No.: 48,199

[22] Filed: Apr. 20, 1993

[30] Foreign Application Priority Data

Apr. 24, 1992 [FR]   France ................................ 92 05060

[51] Int. Cl.⁶ ............................................. H03F 1/30
[52] U.S. Cl. ...................................... 330/149; 330/43; 330/45; 455/63
[58] Field of Search ................................. 330/43–45, 330/149; 332/107, 123, 159; 375/60; 455/63

[56] References Cited

U.S. PATENT DOCUMENTS 3,426,291  2/1969  Weglein .
4,439,741  3/1984  Turner, Jr. ........................... 330/149
4,905,086  2/1990  Tahara ................................. 358/186

FOREIGN PATENT DOCUMENTS 441579  8/1991  European Pat. Off. .
9106149  5/1991  WIPO .

Primary Examiner—James B. Mullins
Attorney, Agent, or Firm—Pollock, Vande Sande & Priddy

[57] ABSTRACT

The voltage variation between the electrodes of the tube of a microwave amplifier (1) causing a phase Shift of the output wave from the microwave amplifier (1), the process according to the invention consists of creating a phase shift of the wave entering the tube of the microwave amplifier (1) that is substantially proportional to the voltage variation and in the direction opposite the phase shift of the output wave caused by this voltage variation.

7 Claims, 3 Drawing Sheets

PROCESS AND DEVICE FOR COMPENSATION OF PHASE INSTABILITIES OF THE WAVE AMPLIFIED BY A MICROWAVE TUBE

BACKGROUND OF THE INVENTION

This invention is a process and device to compensate a voltage variation between the electrodes of the tube of a microwave amplifier so as to diminish the phase variation of the amplified wave and thereby ensure its stability.

It applies notably to improving the phase stability of microwave tube radar transmitters when they are subjected for example to large variations of the duty cycle of the transmitted waveform. More generally, it applies to all types of microwave tube amplifier subjected to large load variations.

Phase instability is preponderant among the various types of instability affecting the operation of microwave tube amplifiers. It alters the quality of the transmitted wave and in particular prevents Doppler processing, known to the expert, using measurements of phase differences between the wave transmitted and the wave received by a radar. These phase instabilities are caused by variations of the voltage between the cathode and the body of the tube. In the case of a klystron or of a travelling wave tube, for example, a 1% variation of this voltage causes a phase rotation of approximately 20° and 40°, respectively. The voltage variations between the cathode and body of the tube of the transmitter are caused by more or less sudden variations of the load on the terminals of the power supply unit delivering the voltage. Such load variations occur, for example, during a transition from the silence condition to full-power transmission, or more generally when there are large variations of the duty cycle of the transmitted waveform, representing strings of patterns or bursts at very different mean values.

A first known solution that decreases these phase rotations consists of very precisely regulating the voltage between the cathode and body of the tube to limit these variations to approximately 1% of the nominal voltage, for example. To accomplish this, this solution makes it necessary in particular to have recourse to power supply units employing a high switching frequency with very advanced regulation systems having a wide pass band and a high gain. But the nominal voltage is often fixed in a range extending from a few kilovolts to many tens of kilovolts, further complicating the building of these power supply units and, more importantly, making them very expensive, in particular because they require circuits and components that are very precise and can withstand very high voltages, and great precautions in adjustment.

This first solution being set aside for reasons of cost, another known solution phase-locks the signal amplified by the transmitter to the signal the transmitter receives, making it possible to use less sophisticated and therefore less expensive power supply units. However, in this case it is impossible to obtain stable operation of the phase lock loop with phase rotations in excess of 90°, because the loop gain then becomes negative because of the characteristics of the sinusoid function of the mixers used in the loop. Such a phase rotation can be reached for example by a travelling wave tube of which the voltage between the electrodes varies by approximately 2%.

This latter solution can however be improved by adding a blocking sampler to the phase lock loop, to preset the correction to be made to the pulse to be processed according to the correction applied to the previous pulse.

The blocking sampler in fact stores the error signal on the pulse that has just been corrected and presets the phase shifter of the phase lock loop for the next correction. This improvement is still not enough, because it fails notably to deal with fluctuations between pulses, since it is in principle effective only for pulses that recur almost identically.

Moreover, such a blocking sampler is difficult to use and complicates adjustment.

SUMMARY OF THE INVENTION

The purpose of the invention is to remedy the aforementioned drawbacks, notably by compensating the effect of a voltage variation between the electrodes of the tube of a microwave amplifier on the phase of the amplified wave by applying the variation to the phase lock loop.

For this purpose, the object of the invention is a process of compensation of a voltage variation between the electrodes of a microwave amplifier, the voltage variation causing a phase shift of the output wave from the microwave amplifier, characterized in that it consists of creating a phase shift of the input wave to the microwave amplifier tube that is substantially proportional to the voltage variation and in the direction opposed to the phase shift of the output wave created by this voltage variation.

The object of the invention is also a device embodying the aforementioned process. In addition to the fact that it eliminates phase instabilities, the main advantages of the invention are that it is economical and simple to use and can be fitted to all types of microwave amplifiers and transmitters.

BRIEF DESCRIPTION OF THE DRAWINGS

Other characteristics and advantages of the invention will become apparent from the description that follows in conjunction with the attached drawings, which show.

DESCRIPTION OF THE INVENTION

Figure 1:
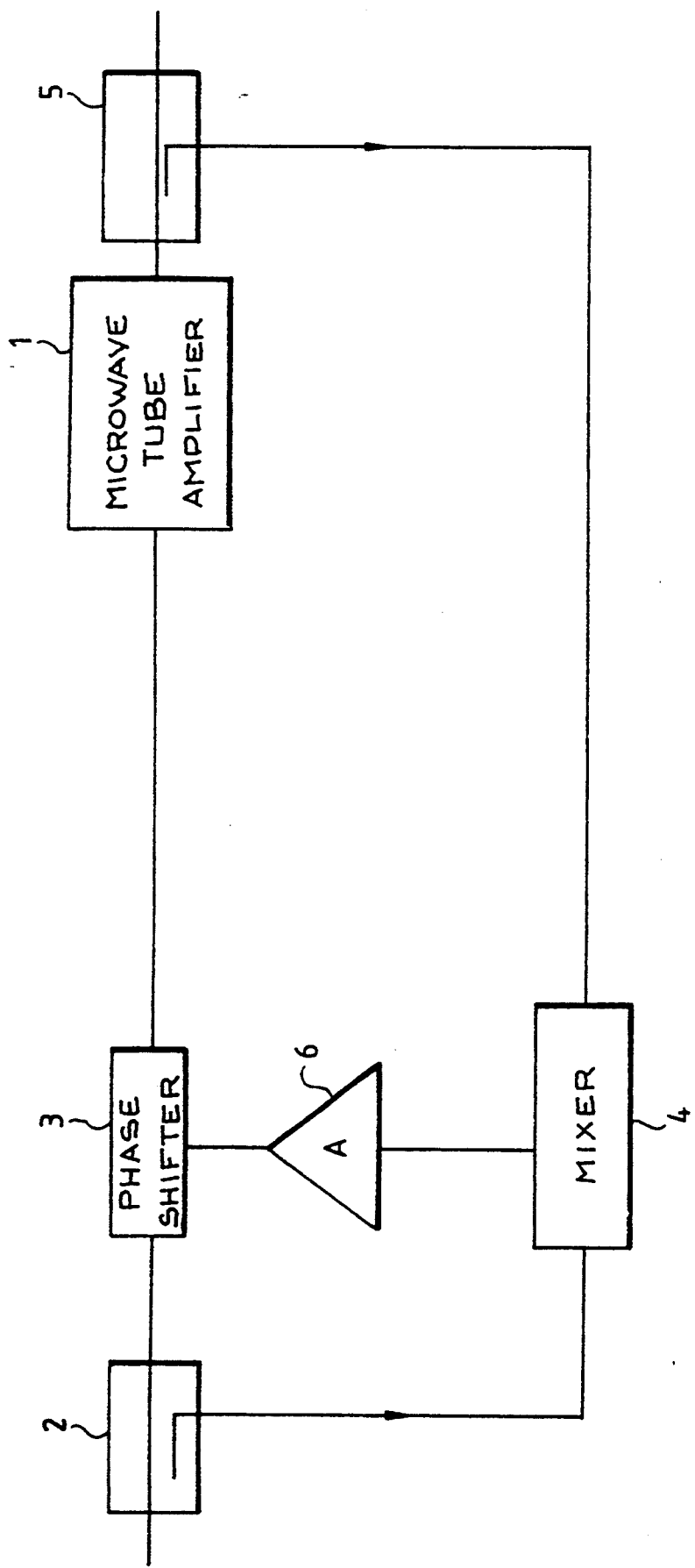
FIG. 1, a phase lock of the output signal of a microwave tube amplifier in accordance with the prior art.

FIG. 1 shows the block diagram of the locking of the output signal of a microwave tube amplifier 1 to the phase of a reference wave, this wave generally being the wave to be amplified, i.e. the input wave to the amplifier 1. This phase lock, known to the prior art, can partially limit the phase variations of the output wave amplified by the microwave tube amplifier 1, these variations being caused notably by ripple of the tube supply voltage, by the intrinsic phase noise of the tube, and by tube power supply load variations. The first two causes of phase variation are relatively limited and reproducible over time and can be effectively compensated by the type of phase lock illustrated by the block diagram of FIG. 1.

Figure 2A:
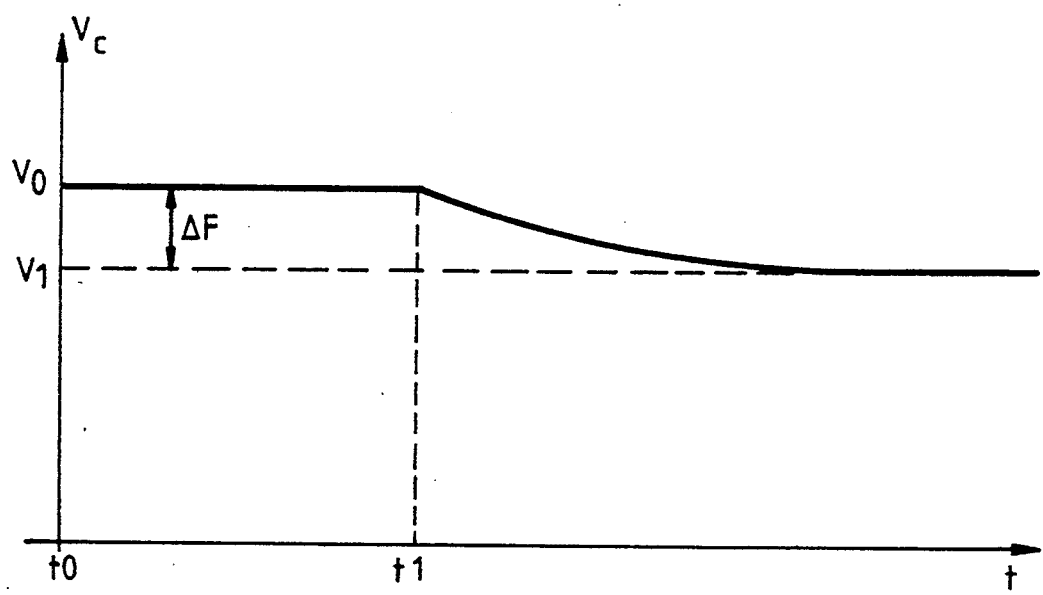
FIG. 2a, an illustration of a voltage variation between the electrodes of a microwave amplifier tube in accordance with the prior art.

For this purpose, the phase lock loop includes for example an input coupler 2 that receives the wave to be amplified, a phase shifter connected to the main output of the input coupler 2, a mixer 4 that receives from the input coupler 2 an image of its input wave, an output coupler 5 having its input connected to the output of the microwave tube amplifier 1 and delivering to the mixer 4 an image of the output wave of the microwave tube amplifier 1, and an analog amplifier 6 having its input connected to the output of the mixer 4 and its output connected to the control input of the phase shifter 3, the output of which is connected to the input of the microwave tube amplifier 1. The output of the mixer 4 delivers to the analog amplifier 6 a voltage representing the phase difference between the two waves it receives, i.e. between the input wave to the coupler 2, here used as reference wave, and the output wave from the microwave tube amplifier 1. The input voltage of the analog amplifier 6 is for example amplified by the amplifier to control the phase shift of the input wave to the microwave tube amplifier 1 by the phase shifter 3. The shifter 3 generally creates a phase shift that depends on its control voltage. The action of the analog amplifier 6 is for example corrected by combinations of integrating or differentiating circuits intended to ensure the stability of the phase lock loop, not shown in the block diagram of FIG. 1 because it is known to the expert. In the case of too large a variation of the voltage between the electrodes of the tube of the amplifier 1, notably between its cathode and its body, the phase lock loop shown by FIG. 1 can no longer ensure stable operation. FIG. 2a shows such a voltage variation. This figure shows the voltage Vc between the cathode and the body of the tube of the amplifier 1 versus time. If the microwave tube amplifier is contained for example in a radar transmitter, an initial voltage Vo delivered between a time origin to and a time t1 may correspond, for example to a stage of radar silence.

From time t1, full-power transmission may for example be initiated. This creates a load variation on the terminals of the power supply unit delivering voltage Vc between the cathode and the body of the tube and causes a drop of this voltage, which at the end of some time reaches a new equilibrium voltage V1.

Unless the regulation of the power supply unit is very effective, the voltage variation $\Delta V$ between the cathode and the body of the tube creates a phase variation, also called a phase rotation, in excess of 90°, of the output wave from the microwave tube amplifier. Indeed, for a travelling wave tube amplifier, for example, a voltage variation of approximately 2% produces a phase rotation of approximately 90° of its output wave. With standard power supply units, a large variation of the duty cycle of the amplified waveform causes such a variation, or even a larger one, and so induces a phase rotation in excess of 90°.

In the case of a microwave tube radar transmitter, these variations may result from a change from one mode to another, in particular from the silence mode to a transmission mode, and more generally from any variation of the duty cycle of the transmitted waveform representing strings of patterns or bursts having very different mean values.

Figure 2B:
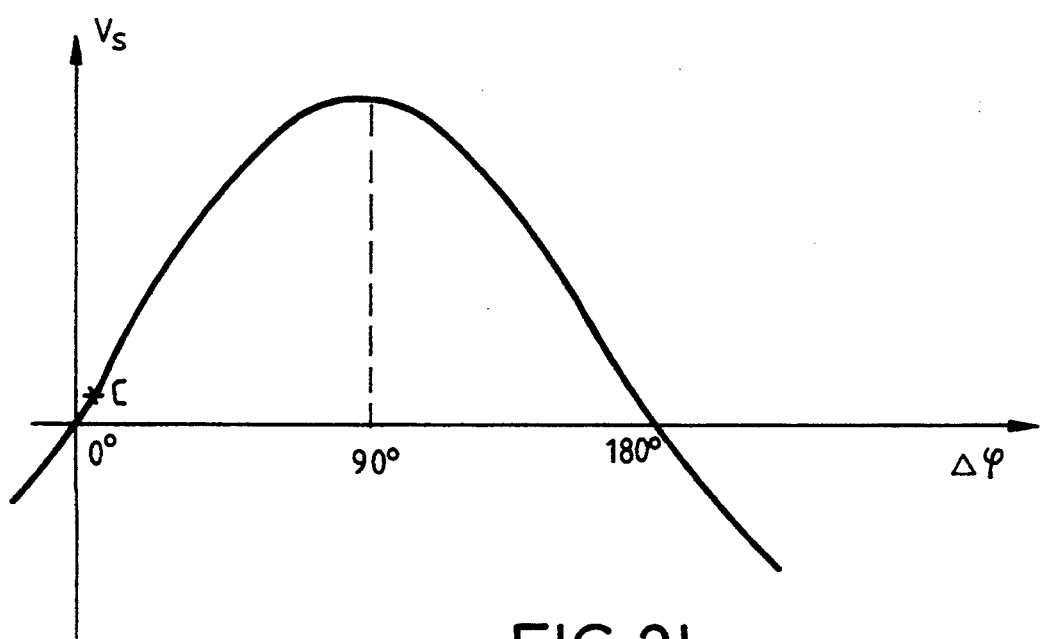
FIG. 2b, an illustration of the transfer function of a mixer used in the aforementioned phase lock.

It is in fact a phase rotation in excess of 90° that prevents the phase lock shown in FIG. 1 from achieving stable operation. In this case, the gain of the loop, which depends on the transfer function of the mixer 4, is negative. FIG. 2b shows this transfer function; it shows the output voltage Vs of the mixer 4 versus the phase difference between its two input waveforms, i.e. between the output waveform from the amplifier 1 and the input wave to the phase lock loop, the phase of which is for example here taken as reference. The gain of the phase lock loop depends primarily on the gain of the analog amplifier 6 and on the slope of the transfer function of the mixer at the operating point concerned. Since the transfer function of the mixer is sinusoidal, its slope is positive between 0° and 90°. On the other hand, beyond 90°, its slope becomes negative. Since the gain of the analog amplifier 6 is positive, the total gain of the phase lock loop is negative, preventing the phase lock from tending towards stable operation. The phase instabilities so produced, preponderant over all other types of instability, cause a phase noise that severely impairs the quality of the transmitted wave. In the case of microwave tube transmitters, these instabilities interfere notably with Doppler processing.

To compensate a voltage variation between the electrodes of the tube of amplifier 1, notably to eliminate the phase instabilities described above, the process according to the invention phase-shifts the input wave to the tube in the direction opposite the phase shift created by the voltage variation, and this phase shift is substantially proportional to this voltage variation. Indeed, the calculations and experiments done by the applicant have shown that the phase shift created by the voltage variation between the electrodes of the tube, notably between its cathode and its body, is generally, in the first order, proportional to this voltage variation. Moreover, for each microwave tube, it is possible to ascertain the coefficient of proportionality, hereinafter referred to as "$\lambda$". $\lambda$ is a positive real number.

If $\Delta V$ is the voltage variation between the electrodes of the tube and $\Delta\psi$ the phase shift of the output wave from the tube caused by this variation $\Delta V$, then, in the first order, the following holds:

$$\Delta\psi = \lambda \Delta V \qquad (1)$$

If $\Delta\psi'$ is the phase shift induced in the input wave to the tube by the process according to the invention, $\Delta\psi'$ being proportional to $\Delta V$ and opposed in direction to $\Delta\psi$, the following also holds:

$$\Delta\psi' = -\lambda' \Delta V \qquad (2)$$

where $\lambda'$ is a positive real number.

With $\lambda$ known from the characteristics of the tube, it is possible to create a phase shift $\Delta\psi'$ on the input wave to the amplifier that is equal to in absolute value and opposite the phase shift $\Delta\lambda$ affecting the output wave from the amplifier by taking $\lambda' = \lambda$. In this case, the ratio of the phase shift of the input wave to the tube to the variation of the voltage between the electrodes of the tube is substantially equal, in absolute value, to the ratio of the phase shift of the output wave from the amplifier 1 created by the voltage variation to this same voltage variation. Nevertheless, in practice, $\lambda'$ may be taken very slightly different from $\lambda$, or even different, notably because of the fact that the phase shift characteristics may differ from one tube to another, without impairing the result brought about by the process according to the invention, which is notably to render stable the operation of the loop phase-locking the output wave from the microwave tube amplifier 1. Indeed, since the instability is caused by the fact that the operating point of the mixer 4 is on a part of its transfer function where the slope is negative, one of the main aims of the invention is to return this operating point to where the slope is positive, and it is not necessary for this that $\lambda=\lambda'$. However, if this is the case, if $\lambda$ and $\lambda'$ are equal, or at least nearly equal, the operating point of the mixer on its transfer function is returned very close to the phase shift $\Delta\psi$ zero, equal to 0°, as illustrated for example by point C on the curve of FIG. 2b. Now, in the vicinity of zero phase shift $\Delta\psi$, close to 0°, the slope of the sinusoidal curve representing the transfer function of the mixer is maximal, and so in this vicinity the gain of the phase lock loop is maximal, and in consequence the performance of the loop is best.

Figure 3:
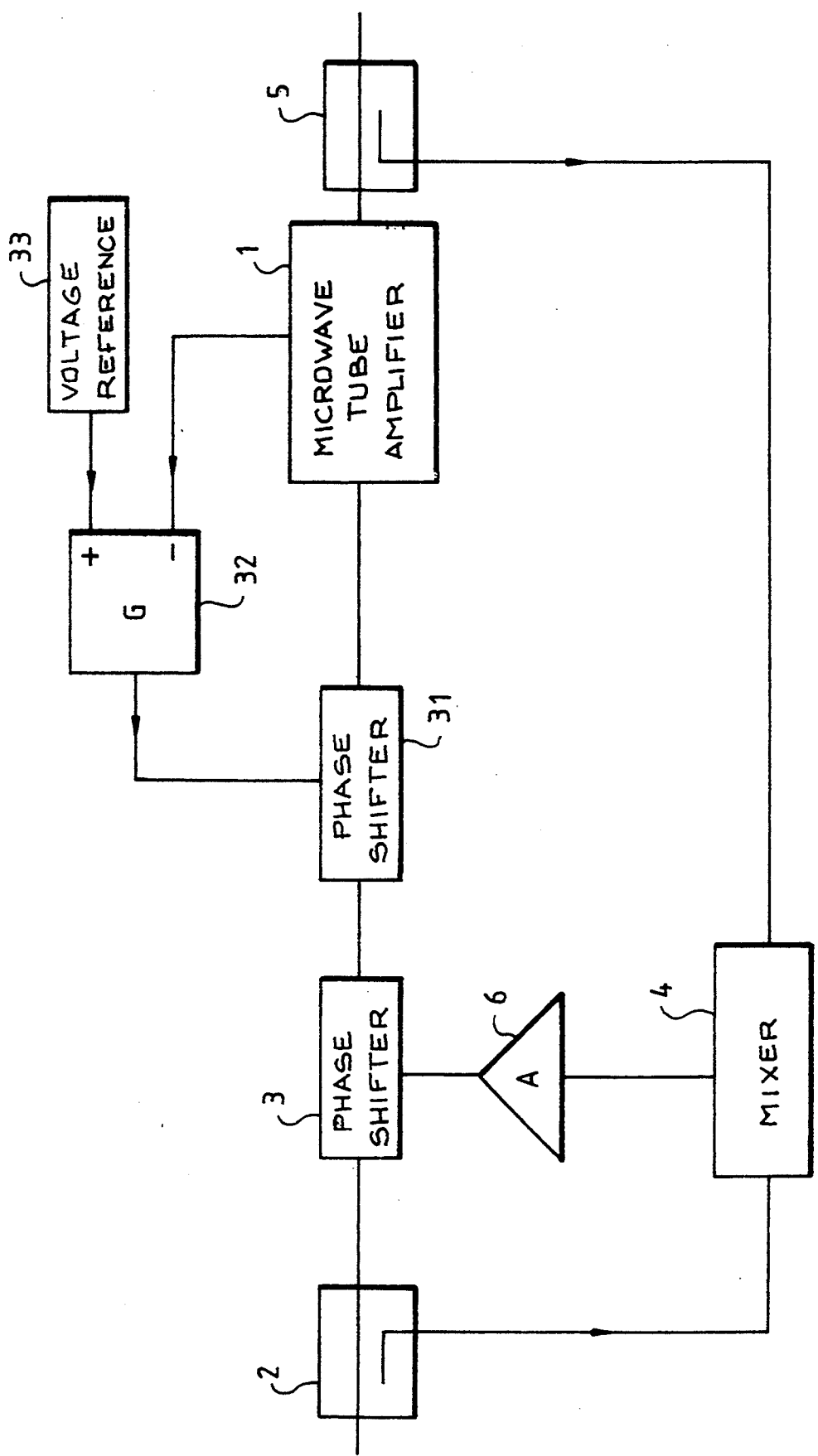
FIG. 3, a possible way of making a device embodying the process according to the invention.

FIG. 3 shows a possible device embodying the process according to the invention. This device is incorporated in the phase lock loop shown in FIG. 1; it includes at least a second phase shifter 31, means of amplification 32, and a voltage reference 33. The second phase shifter 31 is for example placed between the first phase shifter 3 and the microwave tube amplifier 1 and its input is connected to the output of the first phase shifter 3 and its output to the input of the amplifier 1. The control input of the second phase shifter 31 is connected to the output of the means of amplification 32. This output delivers a voltage proportional to the voltage difference between the positive input and the negative input of the means of amplification 32. The positive input of the means of amplification 32 is connected to the output of the voltage reference 33. This voltage reference 33 delivers for example to the means of amplification 32 a voltage corresponding to the nominal operating voltage of the tube of the amplifier 1. The negative input of the means of amplification 32 is connected to one output of the microwave tube amplifier 1 delivering an image of the voltage between the electrodes of the tube. Thus, if $\Delta V$ is the voltage variation between these electrodes with respect to the nominal voltage of the robe and if G is the gain of the means of amplification 32, the second phase shifter 31 being linear, if k is its transfer coefficient between its control voltage and the phase shift it creates, then the phase shift $\Delta\psi'$ applied to the input wave to the tube of the amplifier 1 is given by:

$$\Delta\psi'=k\,G\Delta V \quad (3)$$

The phase shift $\Delta\psi$ created by the voltage variation $\Delta V$ is given by equation (1) and k is an intrinsic characteristic of the second phase shifter 31. In consequence, according to equations (1) and (3), to obtain a phase shift $\Delta\psi'$ equal to the phase shift $\Delta\psi$, it suffices to adjust the gain of the means of amplification 32 so that:

$$\lambda=kG, \text{ or } G=\lambda/k$$

The process according to the invention may also be applied to an open loop, i.e. with no phase locking of the output wave from the microwave tube amplifier 1, meaning that in the application of FIG. 3 for example, the first coupler 2, the mixer 4, the analog amplifier 6, the first phase shifter 3, and the second coupler 5 constituting the phase lock loop could be eliminated. The remaining device embodying the process according to the invention ensures by itself a good level of stability of the phase of the output wave from the amplifier 1. If this phase is locked, it could be done for example by a digital technique. The means of amplification 32 of the device embodying the process according to the invention can for example be constituted by one or more operational amplifiers and a cell of resistors wired in a way known to the expert. These means of amplification may notably contain a resistor-based reading bridge providing a low voltage level representing the high voltage between the electrodes of the tube of the amplifier 1.

What is claimed is:

1. A process for compensating voltage variation between the electrodes of a microwave amplifier tube, the voltage variation ($\Delta V$) causing a phase shift ($\Delta\psi$) of the output wave of the microwave amplifier, the phase shift governed by the equation $$\Delta\psi=\lambda\Delta V$$

wherein $\lambda$, is a coefficient of proportionality of the microwave amplifier tube, and is a positive real number, the process comprising the steps:
  biasing a positive input of a separate amplifier with a voltage nominally equal to the normal operating voltage of the microwave amplifier tube;
  driving a negative input of the separate amplifier with a signal corresponding to $\Delta V$, thereby creating a separate amplifier output proportional to the voltage difference between the positive and negative inputs;
  creating a linear phase shift in response to the separate amplifier output, and expressed as $$\Delta\psi'=kG\Delta V$$

wherein k is the transfer function of a phase shifter, and G is the gain of the separate amplifier, the phase shift being substantially proportional to $\Delta V$ and in a direction opposite a phase shift of the output wave from the microwave amplifier tube; and
  inputting a wave undergoing the created linear phase shift to an input of the microwave amplifier tube.

2. A process as defined in claim 1, further comprising the steps of:
  creating a phase shift in the output wave in response to a particular voltage variation ($\Delta V$); and
  regulating the phase shift occurring to the input wave, so that the ratio of the phase shifted input to the tube is substantially equal in absolute value to the ratio of the phase shift of the output wave created by the particular voltage variation.

3. A process as defined in claim 1, further comprising the steps:
  positioning the amplifier into a feed back loop connecting the amplifier output to an input thereof; and
  locking the phase of the output wave to the phase of a reference microwave signal, introduced into the loop.

4. A process as claimed in claim 3, further comprising the step of connecting the reference wave with the microwave amplifier tube so that the reference wave is amplified by the tube.

5. A process as claimed in claim 1, further comprising the step of transmitting a microwave signal corresponding to the amplifier output.

6. A circuit for compensating voltage variation between the electrodes of a microwave amplifier tube, the voltage variation ($\Delta V$) causing a phase shift ($\Delta\psi$) of the output wave of the microwave amplifier, the phase shift governed by the equation $$\Delta\psi = \lambda\Delta V$$

wherein $\lambda$ is a coefficient of proportionality of the microwave amplifier tube, and is a positive real number, the circuit comprising:
- a separate amplifier having a positive input biased with a reference voltage nominally equal to the normal operating voltage of the microwave amplifier tube;
- a negative input of the separate amplifier driven with a signal corresponding to $\Delta V$, thereby creating a separate amplifier output proportional to the voltage difference between the positive and negative inputs;
- a phase shifter having a first input carrying the wave to be amplified; a second input thereof connected to the separate amplifier output for creating a linear phase shift, by the shifter, in response to the separate amplifier output, and expressed as $$\Delta\psi' = kG\Delta V$$

wherein k is the transfer function of the phase shifter, and G is the gain of the separate amplifier, the phase shift being substantially proportional to $\Delta V$ and in a direction opposite the phase shift of the output wave from the microwave amplifier tube; and
- an output of the phase shifter being connected to an input of the microwave amplifier tube.

7. A device as claimed in claim 6, further comprising a loop locking the phase of the output wave from the microwave amplifier, the loop comprising:
- a first coupler receiving a signal to be amplified, and having one output connected to the input of a mixer;
- a second coupler having its input connected to the output of the microwave amplifier and having an output connected to a second input of the mixer;
- an analog amplifier having its input connected to the output of the mixer;
- a second phase shifter having its input connected to the output of the first coupler, its control input connected to the output of the analog amplifier, and its output connected to the input of the first phase shifter.

* * * * *